(12) United States Patent
Anderson et al.

(10) Patent No.: US 12,720,441 B2
(45) Date of Patent: Aug. 25, 2026

(54) SIGNAL MODULATION BASED ON DUTY-CYCLE CONTROL FOR RADIO FREQUENCY (RF) POWER AMPLIFIERS

(71) Applicant: Synaptics Incorporated, San Jose, CA (US)

(72) Inventors: Steve Anderson, Netanya (IL); Avi Cohen, Bnay-Dror (IL); Udi Suissa, Raanana (IL)

(73) Assignee: Synaptics Incorporated, San Jose, CA (US)

( * ) Notice: Subject to any disclaimer, the term of this patent is extended or adjusted under 35 U.S.C. 154(b) by 281 days.

(21) Appl. No.: 18/414,826

(22) Filed: Jan. 17, 2024

(65) Prior Publication Data

US 2025/0234305 A1 Jul. 17, 2025

(51) Int. Cl.
*H04W 52/18* (2009.01)
*H03F 3/24* (2006.01)

(52) U.S. Cl.
CPC ............ *H04W 52/18* (2013.01); *H03F 3/245* (2013.01); *H03F 2200/451* (2013.01)

(58) Field of Classification Search
CPC .. H04W 52/18; H03F 3/245; H03F 2200/451; H03F 1/0211; H03F 3/19; H03F 3/24;
(Continued)

(56) References Cited

U.S. PATENT DOCUMENTS 5,790,601 A 8/1998 Corrigan et al.
10,135,409 B1 * 11/2018 Cousinard ............ H03F 1/0277
(Continued)

FOREIGN PATENT DOCUMENTS

CN 113824411 A 12/2021
CN 113922777 A 1/2022
CN 114669436 A 6/2022

OTHER PUBLICATIONS

Heidebrecht et al., "Fully Integrated Wideband Doherty PA with Additive-Voltage Supported Load-Modulation in CMOS 130nm," 2019 IEEE MTT-S International Microwave Symposium (IMS), Boston, MA, USA, 2019, pp. 1331-1334, doi: 10.1109/MWSYM.2019.8700774.

(Continued)

*Primary Examiner* — Jinsong Hu
*Assistant Examiner* — Rui M Hu
(74) *Attorney, Agent, or Firm* — Paradice & Li LLP

(57) ABSTRACT

This disclosure provides methods, devices, and systems for wireless communications. The present implementations more specifically relate to reducing the power consumption of radio frequency (RF) power amplifiers without sacrificing power efficiency. In some aspects, an RF transmitter may include a signal generator, a power amplifier, and a duty cycle controller. The signal generator is configured to produce one or more RF signals based on a modulation scheme, and the power amplifier is configured to amplify the one or more RF signals for transmission over a wireless communication channel. In some implementations, the duty cycle controller may adjust a duty cycle of each RF signal based on data to be transmitted according to the modulation scheme. By changing the duty cycle of the RF signal, the duty cycle controller may toggle the output power of the power amplifier and thus modulate the amplitude of the output waveform to carry the data.

18 Claims, 10 Drawing Sheets

(58) Field of Classification Search
CPC ... H03F 3/72; H03F 3/387; H03F 1/02; H03F 3/21; H03G 3/3042; H03K 5/156
See application file for complete search history.

(56) References Cited

U.S. PATENT DOCUMENTS 10,256,854 B1 * 4/2019 Srinivasan .......... H03F 3/45636
2002/0180547 A1 * 12/2002 Staszewski .......... H03F 3/2171 332/115
2008/0290938 A1 * 11/2008 Gupta .......... H03F 3/2178 330/127
2009/0149151 A1 * 6/2009 Bryant .......... H03F 3/217 455/341
2009/0270056 A1 10/2009 Singerl et al.
2010/0225369 A1 * 9/2010 Badaroglu .......... H04B 1/7183 327/158
2011/0018640 A1 * 1/2011 Liang .......... H03F 3/24 330/297
2011/0129037 A1 * 6/2011 Staszewski .......... H03F 3/193 375/316
2011/0267127 A1 * 11/2011 Staszewski .......... H03M 1/68 327/306
2012/0081179 A1 * 4/2012 Visser .......... H03F 1/02 330/251
2012/0214433 A1 * 8/2012 Shimizu .......... H04B 1/40 455/127.2
2014/0125410 A1 * 5/2014 Pamarti .......... H03F 1/0205 330/149
2014/0159933 A1 * 6/2014 Dufrene .......... H03M 1/0612 341/144
2014/0355717 A1 * 12/2014 Lu .......... H03F 3/45179 375/300
2015/0071338 A1 * 3/2015 Talwalkar .......... H04L 27/362 375/238
2015/0139360 A1 * 5/2015 Visser .......... H04B 14/008 375/298
2016/0261293 A1 9/2016 Adabi et al.
2016/0329935 A1 * 11/2016 Singerl .......... H04B 1/0475
2017/0222859 A1 * 8/2017 Lehtinen .......... H03F 3/195
2018/0275229 A1 * 9/2018 Alexeyev .......... G01R 33/3607
2021/0336526 A1 * 10/2021 Ayati .......... H03F 3/2173
2022/0247433 A1 * 8/2022 Perumana .......... H04B 17/345
2022/0316843 A1 * 10/2022 Dower .......... F41H 13/0075
2024/0186948 A1 * 6/2024 Myoung .......... H03D 7/1466
2025/0081121 A1 3/2025 Anderson et al.

OTHER PUBLICATIONS

Jung et al., “A 1.2 V Single Supply Hybrid Current- /Voltage-Mode Three-Way Digital Doherty PA with Built-In Large-Signal Phase Compensation Achieving Less-Than 5° AM-PM,” 2019 IEEE Custom Integrated Circuits Conference (CICC), Austin, TX, USA, 2019, pp. 1-4, doi: 10.1109/CICC.2019.8780290.
Khodkumbhe et al., “Preserving Polar Modulated Class-E Power Amplifier Linearity under Load Mismatch,” 2020 IEEE Radio Frequency Integrated Circuits Symposium (RFIC), Los Angeles, CA, USA, 2020, pp. 295-298, doi: 10.1109/RFIC49505.2020.9218279.
Yu et al., “A High-Voltage-Enabled Class-D Polar PA Using Interactive AM-AM Modulation, Dynamic Matching, and Power-Gating for Average PAE Enhancement,” in IEEE Transactions on Circuits and Systems I: Regular Papers, vol. 64, No. 11, pp. 2844-2857, Nov. 2017, doi: 10.1109/TCSI.2017.2703584.
European Search Report dated Jun. 24, 2025, from EP Application No. 25151919.5-1201.
Extended EP Search Report dated Jan. 24, 2025, from EP Application No. 24196937.7-1201.

* cited by examiner

SIGNAL MODULATION BASED ON DUTY-CYCLE CONTROL FOR RADIO FREQUENCY (RF) POWER AMPLIFIERS

TECHNICAL FIELD

The present implementations relate generally to wireless communication, and specifically to signal modulation based on duty-cycle control for radio frequency (RF) power amplifiers.

BACKGROUND OF RELATED ART

Wireless communication devices rely on radio frequency (RF) transmitters and receivers (also referred to as "wireless radios") to communicate with other devices over a wireless communication channel. Many RF transmitters are configured to modulate data or other information onto a carrier wave and upconvert the modulated waveform to a radio frequency (such as 2.4 GHz), for example, by mixing the modulated waveform with a local oscillator (LO) signal that oscillates at the radio frequency. The resulting RF signal is further amplified by a power amplifier for transmission over the wireless channel via one or more antennas. Different classes of power amplifiers are designed to provide different levels of power efficiency. For example, linear class power amplifiers (such as class A, class B, and class AB amplifiers) sacrifice power efficiency to provide a more linear response or power curve. By contrast, nonlinear class power amplifiers (such as class C, class D, class E, and class F amplifiers) offer greater power efficiency but suffer from nonlinear response.

Many wireless communication devices are battery-operated devices with limited power budgets. As such, many wireless communication devices implement wireless radios with nonlinear class power amplifiers to achieve better power efficiency. However, a nonlinear class power amplifier achieves its maximum power efficiency when operating at its maximum supported output power, whereas the power efficiency tends to degrade when operating at a lower output power. In other words, nonlinear class power amplifiers have a relatively narrow dynamic range in terms of linearity and efficiency. Thus, there is a need to reduce the power consumption of RF power amplifiers (and transmitters) without sacrificing power efficiency.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

One innovative aspect of the subject matter of this disclosure can be implemented in a method of wireless communication performed by a radio frequency (RF) transmitter. The method includes obtaining data for transmission according to a modulation scheme; obtaining one or more RF signals associated with the modulation scheme; adjusting a duty cycle of each RF signal of the one or more RF signals based on the data and the modulation scheme; and providing the one or more RF signals to a set of power amplifiers configured to amplify each RF signal of the one or more RF signals by a respective gain based at least in part on the adjusted duty cycle of the RF signal and produce a modulated waveform carrying the data based on the one or more amplified RF signals.

Another innovative aspect of the subject matter of this disclosure can be implemented in a controller for an RF transmitter, including a processing system and a memory. The memory stores instructions that, when executed by the processing system, cause the controller to obtain data for transmission according to a modulation scheme; obtain one or more RF signals associated with the modulation scheme; adjust a duty cycle of each RF signal of the one or more RF signals based on the data and the modulation scheme; and provide the one or more RF signals to a set of power amplifiers configured to amplify each RF signal of the one or more RF signals by a respective gain based at least in part on the adjusted duty cycle of the RF signal and produce a modulated waveform carrying the data based on the one or more amplified RF signals.

BRIEF DESCRIPTION OF THE DRAWINGS

The present implementations are illustrated by way of example and are not intended to be limited by the figures of the accompanying drawings.

DETAILED DESCRIPTION

Figure 1:
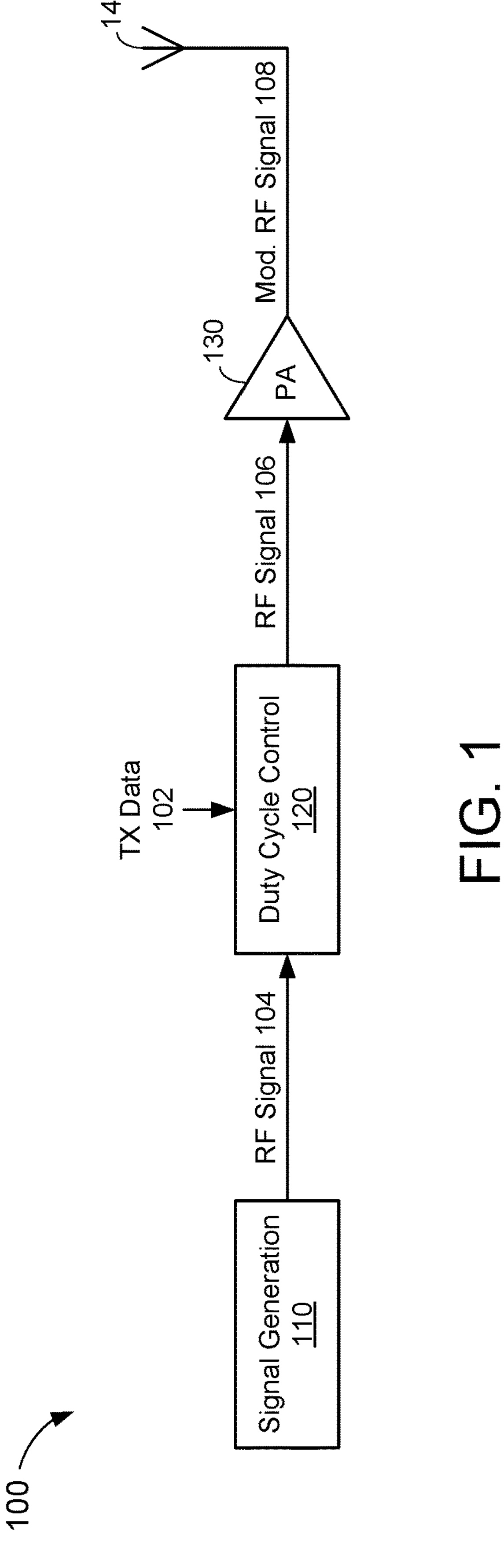
FIG. 1 shows a block diagram of an example radio frequency (RF) transmitter, according to some implementations.

In the following description, numerous specific details are set forth such as examples of specific components, circuits, and processes to provide a thorough understanding of the present disclosure. The term "coupled" as used herein means connected directly to or connected through one or more intervening components or circuits. The terms "electronic system" and "electronic device" may be used interchangeably to refer to any system capable of electronically processing information. Also, in the following description and for purposes of explanation, specific nomenclature is set forth to provide a thorough understanding of the aspects of the disclosure. However, it will be apparent to one skilled in the art that these specific details may not be required to practice the example embodiments. In other instances, well-known circuits and devices are shown in block diagram form to avoid obscuring the present disclosure. Some portions of the detailed descriptions which follow are presented in terms of procedures, logic blocks, processing and other symbolic representations of operations on data bits within a computer memory.

These descriptions and representations are the means used by those skilled in the data processing arts to most effectively convey the substance of their work to others skilled in the art. In the present disclosure, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system. It should be borne in mind, however, that all of these and similar terms are to be associated with the appropriate physical quantities and are merely convenient labels applied to these quantities.

Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described below generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the example input devices may include components other than those shown, including well-known components such as a processor, memory and the like.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium including instructions that, when executed, performs one or more of the methods described above. The non-transitory processor-readable data storage medium may form part of a computer program product, which may include packaging materials.

The non-transitory processor-readable storage medium may comprise random access memory (RAM) such as synchronous dynamic random-access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the embodiments disclosed herein may be executed by one or more processors (or a processing system). The term "processor," as used herein may refer to any general-purpose processor, special-purpose processor, conventional processor, controller, microcontroller, and/or state machine capable of executing scripts or instructions of one or more software programs stored in memory.

As described above, many radio frequency (RF) transmitters are configured to modulate data or other information onto a carrier wave and upconvert the modulated waveform to a radio frequency (such as 2.4 GHZ), for example, by mixing the modulated waveform with a local oscillator (LO) signal that oscillates at the radio frequency. The resulting RF signal is further amplified by a power amplifier for transmission over a wireless communication channel via one or more antennas. Many wireless communication devices are battery-operated devices with limited power budgets. As such, many wireless communication devices implement wireless radios with nonlinear class power amplifiers to achieve better power efficiency. However, a nonlinear class power amplifier achieves its maximum power efficiency when operating at its maximum supported output power, whereas the power efficiency tends to degrade when operating at a lower output power. In other words, nonlinear class power amplifiers have a relatively narrow dynamic range in terms of linearity and efficiency.

Many nonlinear class power amplifiers are designed with transistors operating as switches that supply current to an output load. For example, the drain (or source) of a transistor may be coupled to a high voltage potential (such as a voltage source), the source (or drain) of the transistor may be coupled to a low voltage potential (such as ground), and the gate of the transistor may be driven by the input RF signal. As a result, the transistor typically operates in the saturation region, delivering an amount of current between its source and drain terminals depending on the voltage or amplitude of the input RF signal. The output power and power consumption of the power amplifier depends on the amount and duration of current supplied by the transistor to the output load (such as when the voltage of the input RF signal is above a voltage threshold). Aspects of the present disclosure recognize that the power consumption of such power amplifiers can be reduced, without sacrificing efficiency, by reducing or shortening the duty cycle of the input RF signal. Moreover, because changing the duty cycle of the input RF signal also changes the output power of the power amplifier, aspects of the present disclosure further recognize that the amplitude of the output RF signal can be modulated by toggling or adjusting the duty cycle of the input RF signal.

Various aspects relate generally to RF transmitters, and more particularly, to techniques for reducing the power consumption of RF transmitters without sacrificing power efficiency. In some aspects, an RF transmitter may include a signal generator, a power amplifier, and a duty cycle controller coupled between the signal generator and the power amplifier. The signal generator is configured to produce one or more RF signals based on a modulation scheme, and the power amplifier is configured to amplify the one or more RF signals for transmission over a wireless communication channel. In some implementations, the duty cycle controller may adjust a duty cycle of each RF signal based on data to be transmitted according to the modulation scheme. More specifically, by changing the duty cycle of the RF signal, the duty cycle controller may toggle the output power (or gain) of the power amplifier and thus modulate the amplitude of the output waveform to carry the data according to the modulation scheme.

In some aspects, the modulation scheme may be a quadrature modulation scheme, such as quadrature phase shift keying (QPSK) or quadrature amplitude modulation (QAM), where information is encoded in the phase (and amplitude) of the modulated waveform. In such aspects, the signal generator may be configured to produce a first RF signal representing an in-phase (I) component of the modulated waveform and a second RF signal representing a quadrature (Q) component of the modulated waveform, where the modulated waveform is a sum of the first and second RF signals. In some implementations, the signal generator may control the phases of the first and second RF signals to achieve a desired phase for the modulated waveform based on the data to be transmitted according to the modulation scheme. In some other implementations, the duty cycle controller may adjust the phases of the first and second RF signals to achieve the desired phase for the modulated waveform based on the data to be transmitted according to the modulation scheme.

Particular implementations of the subject matter described in this disclosure can be implemented to realize one or more of the following potential advantages. By controlling the duty cycles of RF signals to modulate the waveform at the power amplifier outputs, aspects of the present disclosure can significantly improve the efficiency of RF transmitters. For example, reducing the duty cycle of the RF signal reduces the duration in which a power amplifier is conducting current and also reduces the output power of the power amplifier while maintaining constant or consistent power efficiency over a relatively large dynamic range. This allows the power amplifier to operate with relatively high power efficiency while reducing its overall power consumption over time. Many existing RF transmitters require phase-locked loops (PLLs), RF mixers, or RF digital-to-analog converters (DACs) to support quadrature modulation. However, by controlling the phase and amplitude of the modulated waveform via the duty cycle controller, aspects of the present disclosure can achieve quadrature modulation without the need for applying modulation via the PLLs, RF mixers, or RF DACs.

FIG. 1 shows a block diagram of an example RF transmitter 100, according to some implementations. The RF transmitter 100 is configured to transmit (TX) data 102 or other digital information, on behalf of a wireless communication device, over a wireless communication channel. In some aspects, the RF transmitter 100 may conform to one or more wireless communication standards. Example suitable wireless communication standards include various Institute of Electrical and Electronics Engineers (IEEE) 802.11 standards, the IEEE 802.15 standards, the Bluetooth® standards as defined by the Bluetooth Special Interest Group (SIG), the Long Term Evolution (LTE), 3G, 4G, 5G, 6G, or 7G standards promulgated by the 3rd Generation Partnership Project (3GPP), the Digital Enhanced Cordless Telecommunications (DECT) standards, and the Zigbee standards, among other examples.

The RF transmitter 100 includes a signal generation component 110, a duty cycle control component 120, and a power amplification (PA) component 130. The signal generation component 110 is configured to produce one or more RF signals 104 based on a modulation scheme used for encoding the TX data 102 onto a modulated waveform for transmission over the wireless communication channel. As used herein, the term "RF signal" may refer to any analog waveform that oscillates at a radio frequency (such as in the range of 3 kHz-300 GHz). For example, where the modulation scheme includes quadrature modulation (such as QPSK or QAM), the signal generation component 110 may produce a pair of RF signals 104 representing the in-phase (I) and quadrature (Q) components of the modulated waveform. For simplicity, only a single RF signal 104 is depicted in the example of FIG. 1.

The power amplifier 130 is configured to amplify RF signals for transmission via one or more antennas 140. In some implementations, the power amplifier 130 may be a nonlinear class RF power amplifier with relatively high power efficiency. Example suitable nonlinear class power amplifiers include class C, class D, class E, and class F amplifiers, among other examples. Aspects of the present disclosure recognize that the duty cycle of the RF signal amplified by the power amplifier 130 controls the duration in which current flows through the power amplifier 130 (which correlates with the output power of the power amplifier 130) over a given period of oscillation. However, many signal generators (such as local oscillators and PLLs) are designed to produce RF signals having fixed duty cycles (such as 50% duty cycles).

In some aspects, the duty cycle control component 120 may control the output power of the power amplifier 130 by adjusting the duty cycle of the RF signal 104. More specifically, the duty cycle control component 120 may produce an RF signal 106 having the same frequency and amplitude as the RF signal 104, but a different duty cycle. Because the duty cycle of the RF signal 106 controls the output power of the power amplifier 130, the duty cycle control component 120 can induce the power amplifier 130 to output a modulated RF signal 108 by varying the duty cycle of the RF signal 106. In some implementations, the duty cycle control component 120 may adjust the duty cycle of the RF signal 104 based on the TX data 102 so that the resulting RF signal 106 causes the power amplifier 130 to modulate the amplitude of the RF signal 108 based on the associated modulation scheme (such that the modulated RF signal 108 carries the TX data 102).

Aspects of the present disclosure further recognize that lowering the duty cycle of the RF signal 104 also lowers the power consumption of the power amplifier 130 over a given period of oscillation. For example, an RF signal 106 having a 25% duty cycle consumes significantly less power from the power amplifier 130, over a given duration, compared to an RF signal 106 having a 50% duty cycle. In some implementations, the duty cycle control component 120 may adjust the duty cycle of the RF signal 104 by reducing its duty cycle below 50%. The reduced duty cycle lowers both the output power and power consumption of the power amplifier 130 over time without sacrificing power efficiency. Thus, by reducing the duty cycle of the RF signal 104, the duty cycle control component 120 may cause the power amplifier 130 to operate below its maximum output power.

In some aspects, the RF signal 108 may be modulated according to a quadrature modulation scheme, such as QPSK or QAM, where information is encoded in the phase (and amplitude) of the modulated waveform. In some implementations, the signal generation component 110 may control the phase of the RF signal 104, based on the TX data 102, to achieve a desired phase for the modulated RF signal 108. In some other implementations, phase modulation may be performed at the duty cycle control component 120 rather than the signal generation component 110. More specifically, in such implementations, the duty cycle control component 120 may adjust the phase and the duty cycle of the RF signal 104, based on the TX data 102, to achieve the desired phase and amplitude for the modulated RF signal 108.

Figure 2:
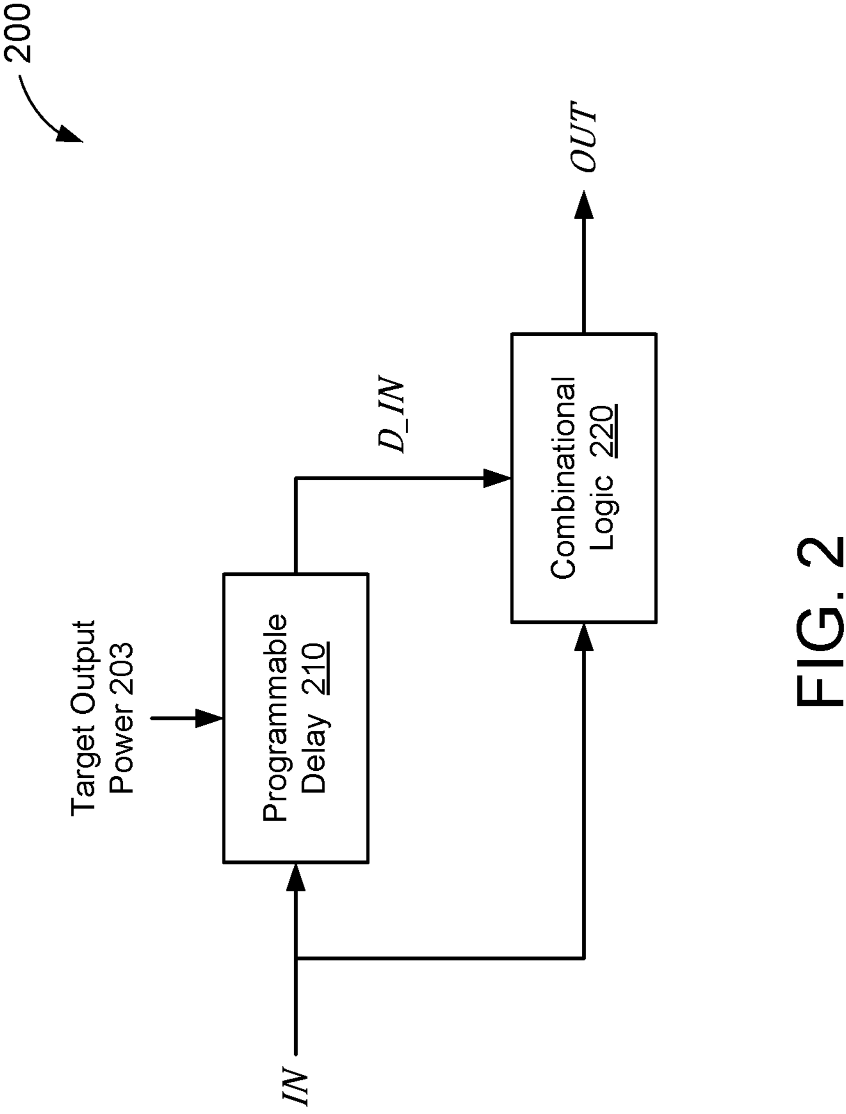
FIG. 2 shows a block diagram of an example duty cycle controller, according to some implementations.

FIG. 2 shows a block diagram of an example duty cycle controller 200, according to some implementations. The duty cycle controller 200 is configured to change or adjust the duty cycle of an input signal (IN). More specifically, the duty cycle controller 200 produces an output signal (OUT) having the same frequency and amplitude as the input signal IN, but different duty cycle. In some implementations, the duty cycle controller 200 may be one example of the duty cycle control component 120 of FIG. 1. With reference to FIG. 1, the input signal IN may be one example of the RF signal 104 input to the duty cycle control component 120 and the output signal OUT may be one example of the RF signal 106 output by the duty cycle control component 120 to the power amplifier 130.

The duty cycle controller 200 includes a programmable delay component 210 and a combinational logic component 220. The programmable delay component 210 is configured to delay the input signal IN by a given duration, resulting in a delayed input signal D_IN. Accordingly, the delayed input signal D_IN and the input signal IN have the same frequency and amplitude but different phases. In some implementations, the programmable delay component 210 may delay the input signal IN based on a target output power 203 (or gain) associated with a power amplifier used to transmit the output signal OUT over a wireless communication channel (such as the power amplifier 130 of FIG. 1). As described with reference to FIG. 1, the output power of the power amplifier 130 can be toggled to modulate the amplitude of the RF signal 108. Thus, the target output power 203 may be associated with the TX data 102.

The combinational logic component 220 is configured to produce the output signal OUT based on the input signal IN and the delayed input signal D_IN. In some implementations, the combinational logic component 220 may combine the input signal IN with the delayed input signal D_IN using combinational logic to produce the output signal OUT. For example, the combinational logic component 220 may include an AND logic gate having inputs to receive the input signal IN and the inverse of the delayed input signal D_IN, and an output to provide the output signal OUT as the logic-AND combination of the input signals IN and D_IN. As a result, the output signal OUT has the same frequency as the original input signal IN but a different duty cycle (due to differences in phase between the input signal IN and the delayed input signal D_IN).

Aspects of the present disclosure recognize that the difference in phase between the input signal IN and the delayed input signal D_IN determines the duty cycle of the output signal OUT. Thus, the programmable delay component 210 may control the duty cycle of the output signal OUT based on the delay applied to the input signal IN. As described with reference to FIG. 1, the duty cycle of the output signal OUT affects the output power of the power amplifier when transmitting the output signal OUT. For example, reducing the duty cycle of the output signal OUT reduces the output power of the power amplifier. In some implementations, the programmable delay component 210 may tune the delay associated with the delayed input signal D_IN so that the resulting duty cycle of the output signal OUT causes the power amplifier to amplify the output signal OUT at the target output power 203.

Figure 3:
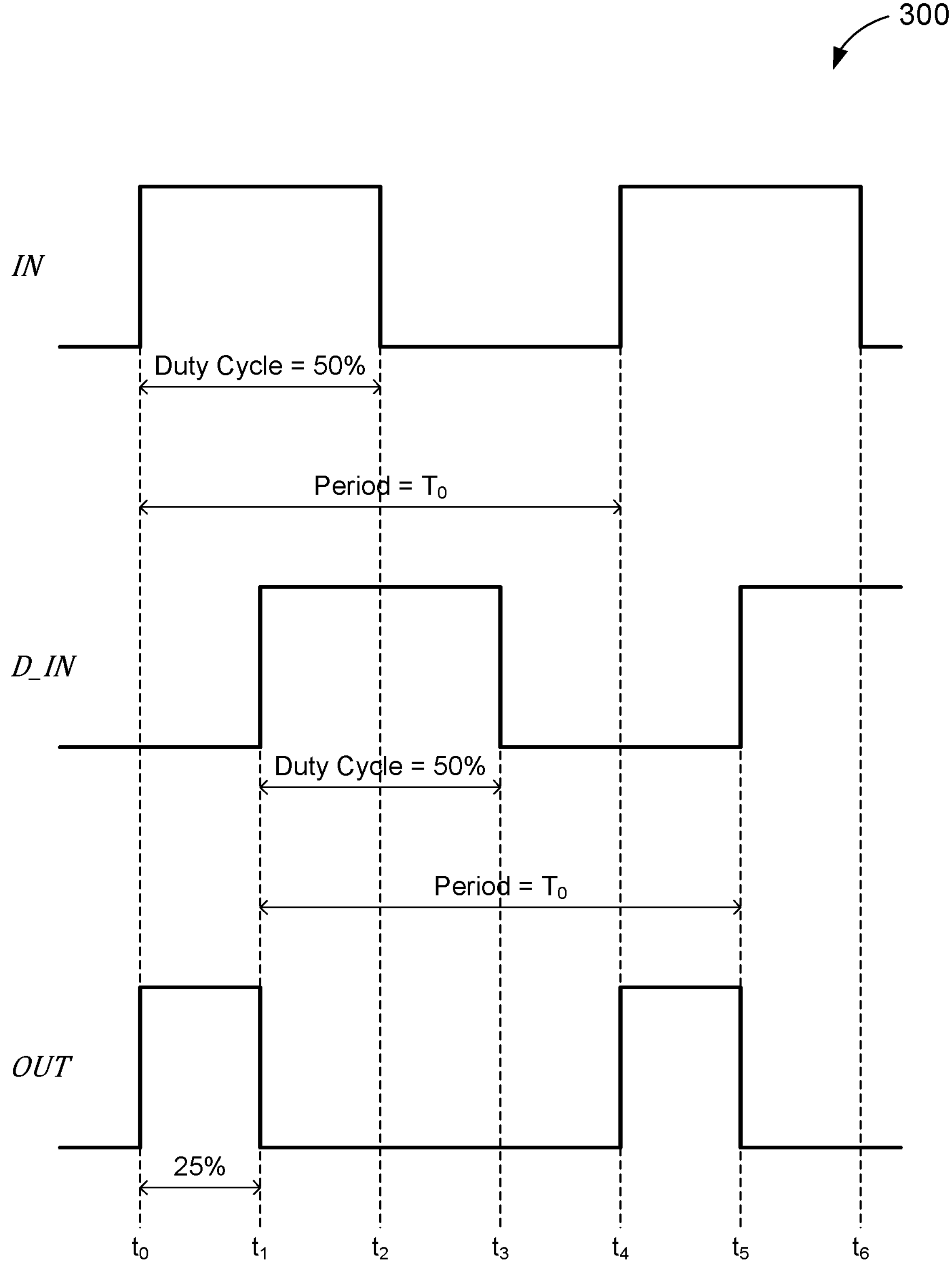
FIG. 3 shows a timing diagram depicting an example operation of a duty cycle controller, according to some implementations.

FIG. 3 shows a timing diagram 300 depicting an example operation of a duty cycle controller, according to some implementations. In some implementations, the duty cycle controller may be one example of the duty cycle controller 200 of FIG. 2. More specifically, the duty cycle controller may be configured to adjust a duty cycle of an input signal IN. As described with reference to FIG. 2, the duty cycle controller delays the input signal IN to produce a delayed input signal D_IN, and combines the input signal IN with the delayed input signal D_IN using combinational logic to produce an output signal OUT having the same frequency and amplitude as the input signal IN, but a different duty cycle.

As shown in FIG. 3, the input signal IN has a 50% duty cycle spanning a period ($T_0$) from times $t_0$ to $t_4$. More specifically, the input signal IN has a relatively high amplitude or voltage (representing a “high” logic state) between times to and $t_2$ and a relatively low amplitude or voltage (representing a “low” logic state) between times $t_2$ and $t_4$. The delayed input signal D_IN has a 50% duty cycle spanning a period $T_0$ from times $t_1$ to $t_5$. More specifically, the delayed input signal D_IN has a relatively high amplitude or voltage between times $t_1$ and $t_3$ and a relatively low amplitude or voltage between times $t_3$ and $t_5$. In the example of FIG. 3, the delayed input signal D_IN is 90° out of phase with the input signal IN. In other words, the delayed input signal D_IN transitions from low to high (at time $t_1$) halfway between times $t_0$ and $t_2$, and transitions from high to low (at time $t_3$) halfway between times $t_2$ and $t_4$.

In the example of FIG. 3, the output signal OUT represents the logical AND of the input signal IN and the inverse of the delayed input signal $\overline{D\_IN}$ ($OUT=IN\wedge\overline{D\_IN}$). Thus, the output signal OUT has a relatively high amplitude or voltage from times $t_0$ to $t_1$ before transitioning to a relatively low amplitude or voltage at time $t_1$ (coinciding with a low-to-high transition of the delayed input signal D_IN). The output signal OUT maintains the low amplitude or voltage from times $t_1$ to $t_4$ until transitioning back to the high amplitude or voltage at time $t_4$ (coinciding with a low-to-high transition of the input signal IN). The output signal OUT maintains the high amplitude or voltage from times $t_4$ to $t_5$ until transitioning back to the low amplitude or voltage at time $t_5$ (coinciding with another low-to-high transition of the delayed input signal D_IN). As a result, the output signal OUT has a 25% duty cycle spanning a period $T_0$ from times $t_0$ to $t_4$. Thus, in the example of FIG. 3, the duty cycle controller reduces the duty cycle of the input signal IN by half.

Figure 4:
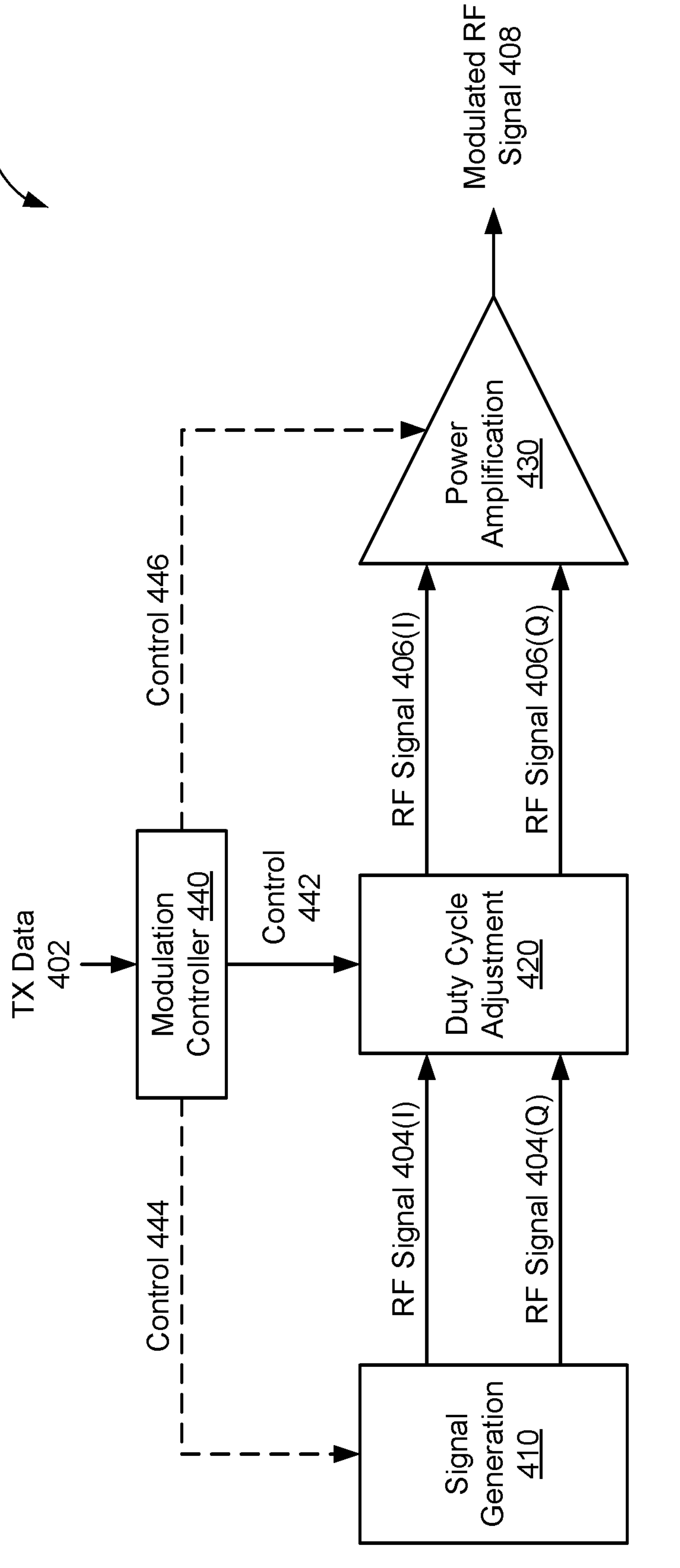
FIG. 4 shows a block diagram of an example RF transmitter that supports quadrature modulation, according to some implementations.

FIG. 4 shows a block diagram of an example RF transmitter 400 that supports quadrature modulation, according to some implementations. In some implementations, the RF transmitter 400 may be one example of the RF transmitter 100 of FIG. 1. More specifically, the RF transmitter 400 is configured to transmit (TX) data 402 or other digital information, on a modulated RF signal 408, over a wireless communication channel. With reference to FIG. 1, the TX data 402 may be one example of the TX data 102 and the modulated RF signal 408 may be one example of the modulated RF signal 108.

The RF transmitter 400 includes a signal generation component 410, a duty cycle control component 420, a power amplification component 430, and a modulation controller 440. The signal generation component 410 together with duty cycle adjustment component 420 are configured to produce a pair of RF signals 406(I) and 406(Q) that oscillate at a radio frequency. More specifically, the signal generation component 410 is configured to produce a pair of RF signals 404(I) and 404(Q), where the RF signal 404(I) represents an in-phase (I) component of the modulated RF signal 408 and the RF signal 404(Q) represents a quadrature phase (Q) component of the modulated RF signal 408. The duty cycle adjustment component 420 is configured to adjust the duty cycles of the RF signals 404(I) and 404(Q) based on a control word 442 to modulate an amplitude of the RF signal 408. More specifically, the duty cycle adjustment component 420 may produce RF signals 406(I) and 406(Q) having the same frequencies and amplitudes as the RF signals 404(I) and 404(Q), respectively, but different duty cycles (such as described with reference to FIGS. 1-3).

The power amplification component 430 is configured to produce the modulated RF signal 408 based on the RF signals 406(I) and 406(Q). More specifically, the power amplification component 430 may amplify each of the RF signals 406(I) and 406(Q) by a respective gain based, at least in part, on the duty cycle of the RF signal (such as described with reference to FIG. 1). In some implementations, the power amplification component 430 may include one or more nonlinear class RF power amplifiers configured to amplify each of the RF signals 406(I) and 406(Q) (such as class C, class D, class E, or class F amplifiers). The power amplification component 430 may further sum or combine the amplified RF signals (not shown for simplicity) to produce the modulated RF signal 408. In other words, the modulated RF signal 408 represents the sum of the I and Q component outputs of the power amplification component 430.

In some aspects, the modulation controller 440 may control or manage an operation of the RF transmitter 400 based on the TX data 402. More specifically, the modulation controller 440 may control at least one of the components 410, 420, or 430 of the RF transmitter 400 to adjust a phase and amplitude of the modulated RF signal 408 so that the modulated RF signal 408 carries the TX data 402 according to a quadrature modulation scheme (such as QPSK or QAM). In some implementations, the modulation controller 440 may control an amplitude of the modulated RF signal 408 via the duty cycle adjustment component 420. In such implementations, the modulation controller 440 may convert the TX data 402 to one or more control words 442 that cause the duty cycle adjustment component 420 to produce each of the RF signals 406(I) and 406(Q) with a respective duty cycle that results in the desired amplitude for the modulated RF signal 408 (after being amplified and summed by the power amplification component 430).

In some implementations, the modulation controller 440 may control a phase of the modulated RF signal 408 via the signal generation component 410. In such implementations, the modulation controller 440 may convert the TX data 402 to one or more control words 444 that cause the signal generation component 410 to produce each of the RF signals 404(I) and 404(Q) with a respective phase offset that results in the desired phase for the modulated RF signal 408. In some other implementations, the modulation controller 440 may control the phase of the modulated RF signal 408 via the duty cycle adjustment component 420. In such implementations, the modulation controller 440 may convert the TX data 402 to one or more control words 442 that cause the duty cycle adjustment component 420 to produce each of the RF signals 406(I) and 406(Q) with a respective duty cycle and phase offset that results in the desired phase and amplitude for the modulated RF signal 408.

Still further, in some implementations, the modulation controller 440 may control the amplitude of the modulated RF signal 408 via the duty cycle adjustment component 420 and the power amplification component 430. In such implementations, the modulation controller 402 may convert the TX data 402 to a set of control words 442 and 446 representing fine and coarse amplitude control values, respectively. The coarse amplitude control value 446 may select one of multiple ("digital") power amplifiers provided by the power amplification component 430, where each power amplifier has a respective range of output power. The fine amplitude control value 442 may further select a duty cycle associated with a desired gain for the selected power amplifier. In other words, the combination of control words 442 and 446 causes the duty cycle adjustment component 420 to produce each of the RF signals 406(I) and 406(Q) with a respective duty cycle that, when amplified by the power amplifier selected by the control word 446, results in the desired amplitude for the modulated RF signal 408.

Figure 5:
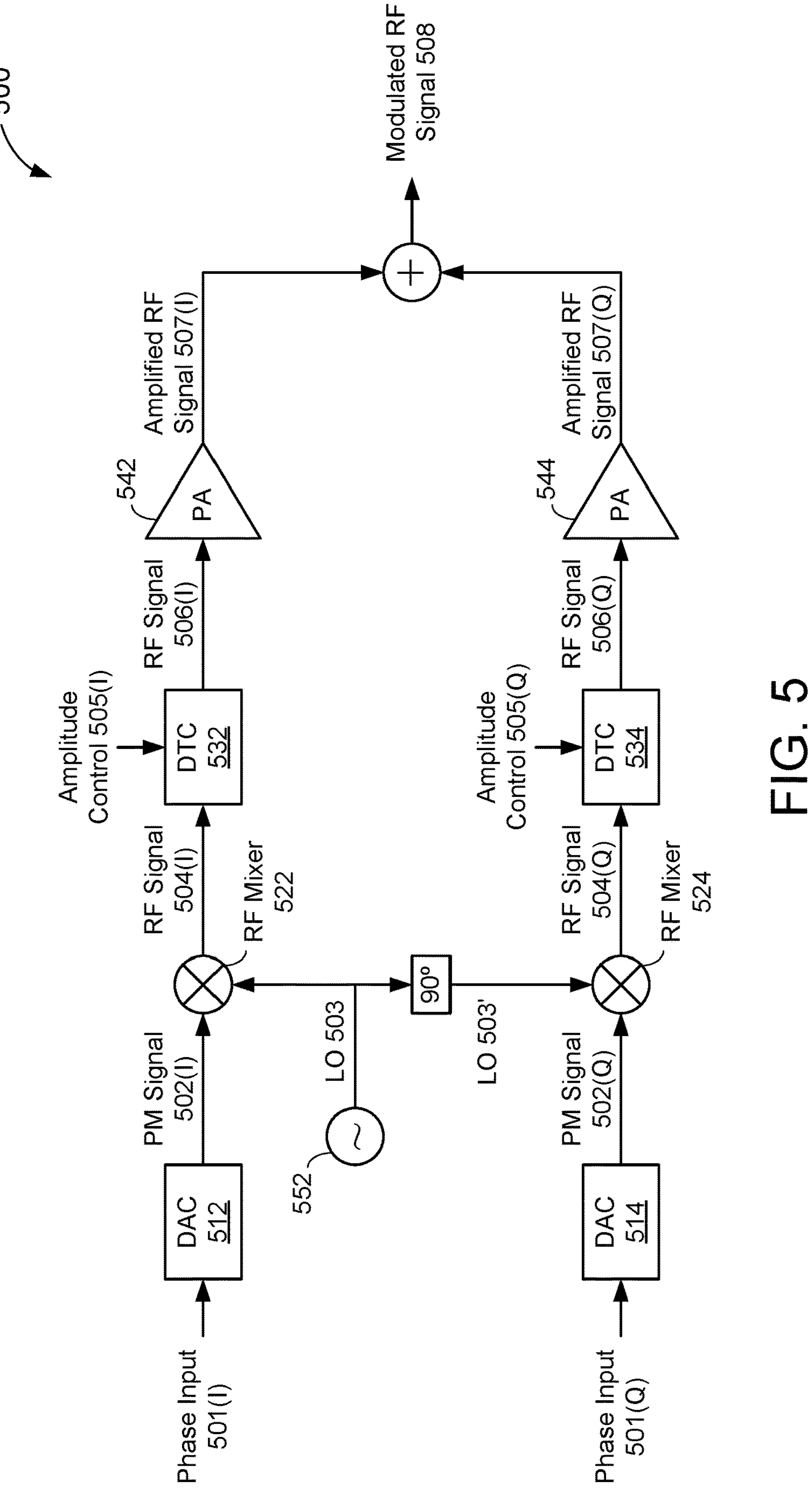
FIG. 5 shows another block diagram of an example RF transmitter that supports quadrature modulation, according to some implementations.

FIG. 5 shows another block diagram of an example RF transmitter 500 that supports quadrature modulation, according to some implementations. In some implementations, the RF transmitter 500 may be one example of the RF transmitter 400 of FIG. 4. More specifically, the RF transmitter 500 is configured to produce a modulated RF signal 508 based on digital phase inputs 501(1) and 501(Q) and amplitude control words 505(1) and 505(Q).

In some implementations, the phase inputs 501(I) and 501(Q) and amplitude control words 505(1) and 505(Q) may represent TX data to be carried on the modulated RF signal 508. With reference to FIG. 4, the phase inputs 501(1) and 501(Q) may be one example of the control words 444, and the amplitude control words 505(1) and 505(Q) may be one example of the control words 442, generated by the modulation controller 440 based on the TX data 402, and the modulated RF signal 508 may be one example of the modulated RF signal 408. More specifically, the phase inputs 501(1) and 501(Q) may control a phase of the modulated RF signal 508 in accordance with a quadrature modulation scheme (such as QPSK or QAM), and the amplitude control words 505(I) and 505(Q) may control an amplitude of the modulated RF signal 508 in accordance with the quadrature modulation scheme.

The RF transmitter 500 includes digital-to-analog converters (DACs) 512 and 514, RF mixers 522 and 524, duty cycle controllers (DTCs) 532 and 534, power amplifiers (PAs) 542 and 544, and a local oscillator 552 that oscillates at a radio frequency. The DACs 512 and 514 are configured to convert the digital phase inputs 501(I) and 501(Q) to analog phase-modulated (PM) signals 502(I) and 502(Q), respectively. In some implementations, the DACs 512 and 514 may be substituted or replaced with digital precise phase shifters. As a result, the PM signal 502(I) is an analog waveform having a phase associated with the digital phase input 501(I) and the PM signal 502(Q) is an analog waveform having a phase associated with the digital phase input 501(Q). In some implementations, each of the PM signals 502(I) and 502(Q) may be passed through a reconstruction filter (not shown for simplicity) to smooth over any quantization associated with the DACs 512 and 514.

The RF mixers 522 and 524 are configured to upconvert the PM signals 502(I) and 502(Q) to RF signals 504(I) and 504(Q), respectively, having a radio frequency. More specifically, the RF mixer 522 produces the RF signal 504(I) by mixing the PM signal 502(I) with a local oscillator (LO) signal 503 generated by the local oscillator 552, and the RF mixer 524 produces the RF signal 504(Q) by mixing the PM signal 502(Q) with an LO signal 503' that is also generated by the local oscillator 552 but is 90° out of phase with the LO signal 503. As such, the RF signals 504(I) and 504(Q) represent in-phase and quadrature components of the modulated RF signal 508. With reference to FIG. 4, the RF signals 504(I) and 504(Q) may be examples of the RF signals 404(I) and 404(Q), respectively, output by the signal generation component 410.

The DTCs 532 and 534 are configured to adjust the duty cycles of the RF signals 504(I) and 504(Q) based on the amplitude control words 505(I) and 505(Q), respectively. More specifically, the DTC 532 may produce an RF signal 506(I) having a duty cycle associated with the amplitude control word 505(1) and the DTC 534 may produce an RF signal 506(Q) having a duty cycle associated with the amplitude control word 505(Q). As described with reference to FIGS. 1-3, the RF signal 506(I) has the same frequency and amplitude, but different duty cycle, as the RF signal 504(I), and the RF signal 506(Q) has the same frequency and amplitude, but different duty cycle, as the RF signal 504(Q). With reference to FIG. 4, the RF signals 506(I) and 506(Q) may be examples of the RF signals 406(I) and 406(Q), respectively, output by the duty cycle adjustment component 420.

The PAs 542 and 544 are configured to amplify the RF signals 506(I) and 506(Q) by respective gains based on the duty cycle of each RF signal. In some implementations, each of the power amplifiers 542 and 544 may be a nonlinear class RF power amplifier (such as a class C, class D, class E, or class F amplifier, among other examples). Thus, the PA 542 may produce an amplified RF signal 507(I), where the voltage gains between the RF signals 506(I) and 506(I) depend on the duty cycle of the RF signal 506(I). Similarly, the PA 544 may produce an amplified RF signal 507(Q), where the voltage gains between the RF signals 506(Q) and 507(Q) depend on the duty cycle of the RF signal 506(Q). The amplified RF signals 507(I) and 507(Q) are summed together to produce the modulated RF signal 508.

In the example of FIG. 5, the DACs 512 and 514 are configured to modulate the phase of the RF signal 508 in response to the phase inputs 501(1) and 501(Q) and the DTCs 532 and 534 are configured to modulate the amplitude of the RF signal 508 in response to the amplitude control words 505(1) and 505(Q). For example, the phase inputs 501(I) and 501(Q) may control the phases of the PM signals 502(I) and 502(Q), respectively, so that the modulated RF signal 508 has a desired phase when the resulting amplified RF signals 507(I) and 507(Q) are summed or combined. Further, the amplitude control words 505(1) and 505(Q) may control the duty cycles of the RF signals 506(I) and 506(Q), respectively, so that the modulated RF signal 508 has a desired amplitude when the resulting amplified RF signals 507(I) and 507(Q) are summed or combined.

Figure 6:
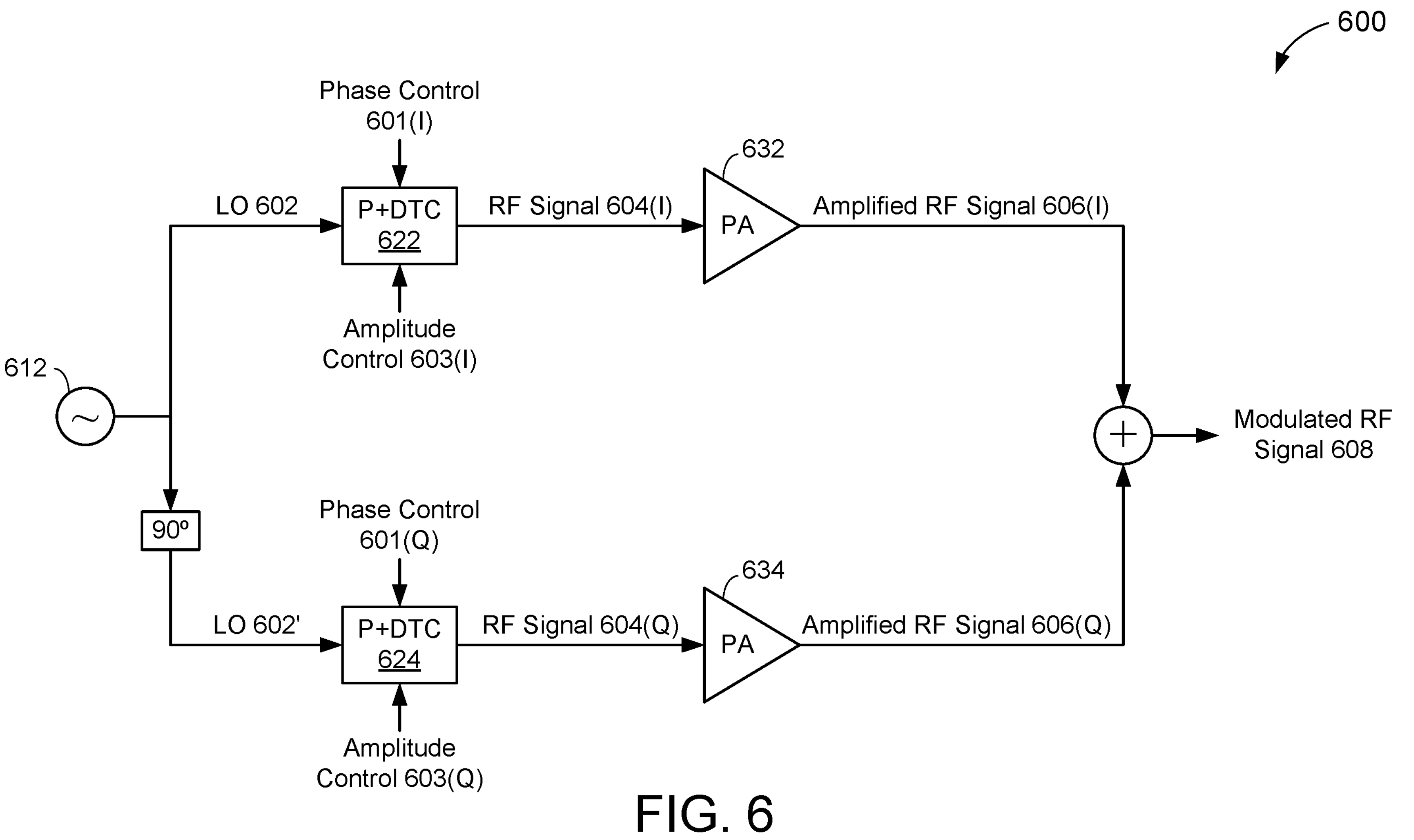
FIG. 6 shows another block diagram of an example RF transmitter that supports quadrature modulation, according to some implementations.

FIG. 6 shows another block diagram of an example RF transmitter 600 that supports quadrature modulation, according to some implementations. In some implementations, the RF transmitter 600 may be one example of the RF transmitter 400 of FIG. 4. More specifically, the RF transmitter 600 is configured to produce a modulated RF signal 608 based on phase control words 601(I) and 601(Q) and amplitude control words 603(I) and 603(Q).

In some implementations, the phase control words 601(1) and 601(Q) and amplitude control words 603(I) and 603(Q) may represent TX data to be carried on the modulated RF signal 608. With reference to FIG. 4, the phase control words 601(I) and 601(Q) and amplitude control words 603(I) and 603(Q) may be one example of the control words 442 generated by the modulation controller 440 based on the TX data 402, and the modulated RF signal 608 may be one example of the modulated RF signal 408. More specifically, the phase control words 601(I) and 601(Q) may control a phase of the modulated RF signal 608 in accordance with a quadrature modulation scheme (such as QPSK or QAM), and the amplitude control words 603(I) and 603(Q) may control an amplitude of the modulated RF signal 608 in accordance with the quadrature modulation scheme.

The RF transmitter 600 includes a local oscillator 612, phase and duty cycle controllers (P+DTCs) 622 and 624, and power amplifiers (PAs) 632 and 634. In contrast with the RF transmitter 500 of FIG. 5, the RF transmitter 600 does not include any DACs or RF mixers. The local oscillator 612 generates an LO signal 602 that oscillates at a radio frequency. The LO signal 602 is provided as input to the P+DTC 622, and a phase-shifted LO signal 602' is provided as input to the P+DTC 624. The phase-shifted LO signal 602' oscillates at the same radio frequency as the LO signal 602 but is 90° out of phase with the LO signal 602. As such, the LO signals 602 and 602' represent in-phase and quadrature components of the modulated RF signal 608. With reference to FIG. 4, the LO signals 602 and 602' may be examples of the RF signals 404(I) and 404(Q), respectively, output by the signal generation component 410.

The P+DTCs 622 and 624 are configured to adjust the duty cycles and phases of the LO signals 602 and 602', respectively. More specifically, the P+DTC 622 may produce an RF signal 604(I) having a phase associated with the phase control word 601(I) and a duty cycle associated with the amplitude control word 603(I), and the P+DTC 624 may produce an RF signal 604(Q) having a phase associated with the phase control word 601(Q) and a duty cycle associated with the amplitude control word 603(Q). As described with reference to FIGS. 1-3, the RF signal 604(I) has the same frequency and amplitude, but different phase and duty cycle, as the LO signal 602, and the RF signal 604(Q) has the same frequency and amplitude, but different duty cycle, as the LO signal 602'. With reference to FIG. 4, the RF signals 604(I) and 604(Q) may be examples of the RF signals 406(I) and 406(Q), respectively, output by the duty cycle adjustment component 420.

The PAs 632 and 634 are configured to amplify the RF signals 604(I) and 604(Q) by respective gains based on the duty cycle of each RF signal. In some implementations, each of the power amplifiers 632 and 634 may be a nonlinear class RF power amplifier (such as a class C, class D, class E, or class F amplifier, among other examples). Thus, the PA 632 may produce an amplified RF signal 606(I), where the voltage gains between the RF signals 604(I) and 606(I) depend on the duty cycle of the RF signal 604(I). Similarly, the PA 632 may produce an amplified RF signal 606(Q), where the voltage gains between the RF signals 604(Q) and 606(Q) depend on the duty cycle of the RF signal 604(Q). The amplified RF signals 606(I) and 606(Q) are summed together to produce the modulated RF signal 608.

In the example of FIG. 6, the P+DTCs 622 and 624 are configured to modulate the phase of the RF signal 608 in response to the phase control words 601(I) and 601(Q), and further configured to modulate the amplitude of the RF signal 608 in response to the amplitude control words 603(I) and 603(Q). For example, the phase control words 601(1) and 601(Q) may control the phases of the RF signals 604(I) and 604(Q), respectively, so that the modulated RF signal 608 has a desired phase when the resulting amplified RF signals 606(I) and 606(Q) are summed or combined. Further, the amplitude control words 603(I) and 603(Q) may control the duty cycles of the RF signals 604(I) and 604(Q), respectively, so that the modulated RF signal 608 has a desired amplitude when the resulting amplified RF signals 606(I) and 606(Q) are summed or combined.

Figure 7:
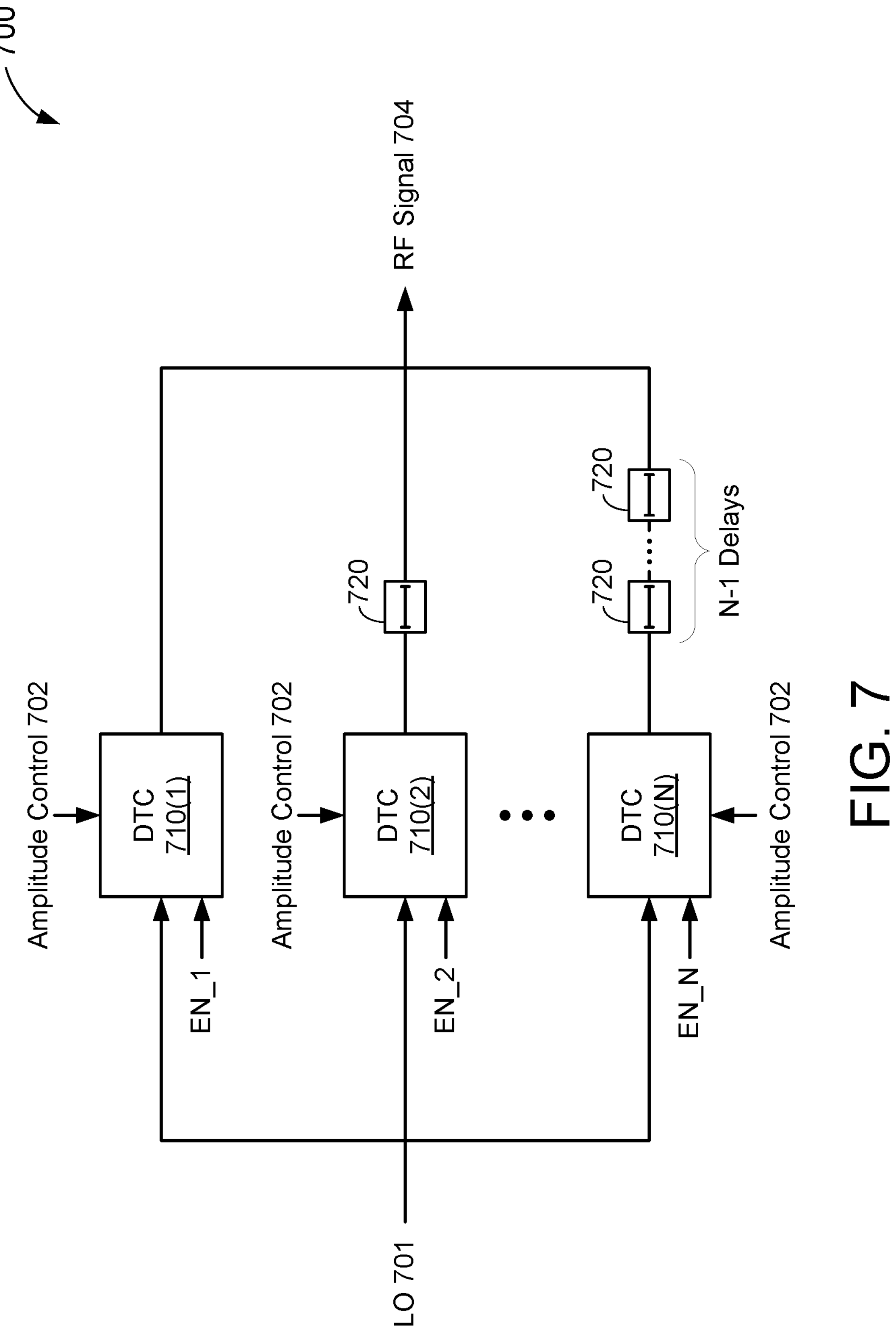
FIG. 7 shows a block diagram of an example phase and duty cycle controller, according to some implementations.

FIG. 7 shows a block diagram of an example phase and duty cycle controller 700, according to some implementations. In some implementations, the controller 700 may be one example of any of the P+DTCs 622 or 624 of FIG. 6. More specifically, the controller 700 is configured to produce an RF signal 704 based on an LO signal 701. With reference to FIG. 6, the LO signal 701 may be one example of any of the LO signals 602 or 602' and the RF signal 704 may be one example of any of the RF signals 604(I) or 604(Q).

The controller 700 includes a number (N) of duty cycle controllers (DTCs) 710(1)-710(N), coupled in parallel, and zero or more delay elements 720 coupled to the output (or input) of each DTC. Each of the DTCs 710(1)-710(N) is configured to adjust the duty cycle of the LO signal 701 based on an amplitude control word 702 (such as described with reference to FIGS. 1-5). With reference to FIG. 6, the amplitude control word 702 may be one example of the amplitude control word 603(I) or the amplitude control word 603(Q). However, only one of the DTCs 710(1)-710(N) may be activated at any given time based on a set of enable signals EN_1-EN_N. With reference to FIG. 6, the enable signals EN_1-EN_N may be one example of the phase control word 601(1) or the phase control word 601(Q). More specifically, only one of the enable signals EN_1-EN_N may be asserted (such as to a logic high state) at any given time while the remaining enable signals are deasserted (such as to a logic low state). The asserted enable signal EN_1-EN_N activates one of the DTCs 710-710(N), respectively, causing the active DTC to produce the RF signal 704.

Each of the DTCs 710(1)-710(N) has a different number of delay elements 720 coupled to its output to apply different amounts of phase delay to the RF signal 704. As shown in FIG. 7, the number of delay elements 720 coupled to the output of each DTC increases incrementally between the first DTC 710(1) and the $N^{th}$ DTC 710(N). For example, no delay elements are coupled to the output of the first DTC 710(1), exactly one delay element 720 is coupled to the output of the second DTC 710(2), and a total of N−1 delay elements 720 are coupled to the output of the $N^{th}$ DTC 710(N). As a result, the enable signals EN_1-EN_N determine the amount of phase delay to be applied to the RF signal 704. For example, when the enable signal EN_0 is asserted, the controller 700 may not apply any phase delay to the RF signal 704. By contrast, when the enable signal EN_N is asserted, the controller 700 may apply the maximum amount of phase delay to the RF signal 704.

In the example of FIG. 7, the delay elements 720 are shown coupled to the outputs of the DTCs 710(2)-710(N). However, in some implementations, the relative positioning of the DTCs 710(1)-710(N) and the delay elements 720 may be reversed. For example, the DTC 710(2) may include a single delay element 720 coupled to its input (rather than its output) and the DTC 710(N) may include N−1 delay elements 720 coupled to its input (rather than its output). In some other implementations, delay elements 720 may be distributed between the inputs and the outputs of one or more of the DTCs 710(1)-710(N). For example, the DTC 710(N) may include a number (M) of delay elements 720 coupled to its input and N−M−1 delay elements 720 coupled to its output.

Figure 8:
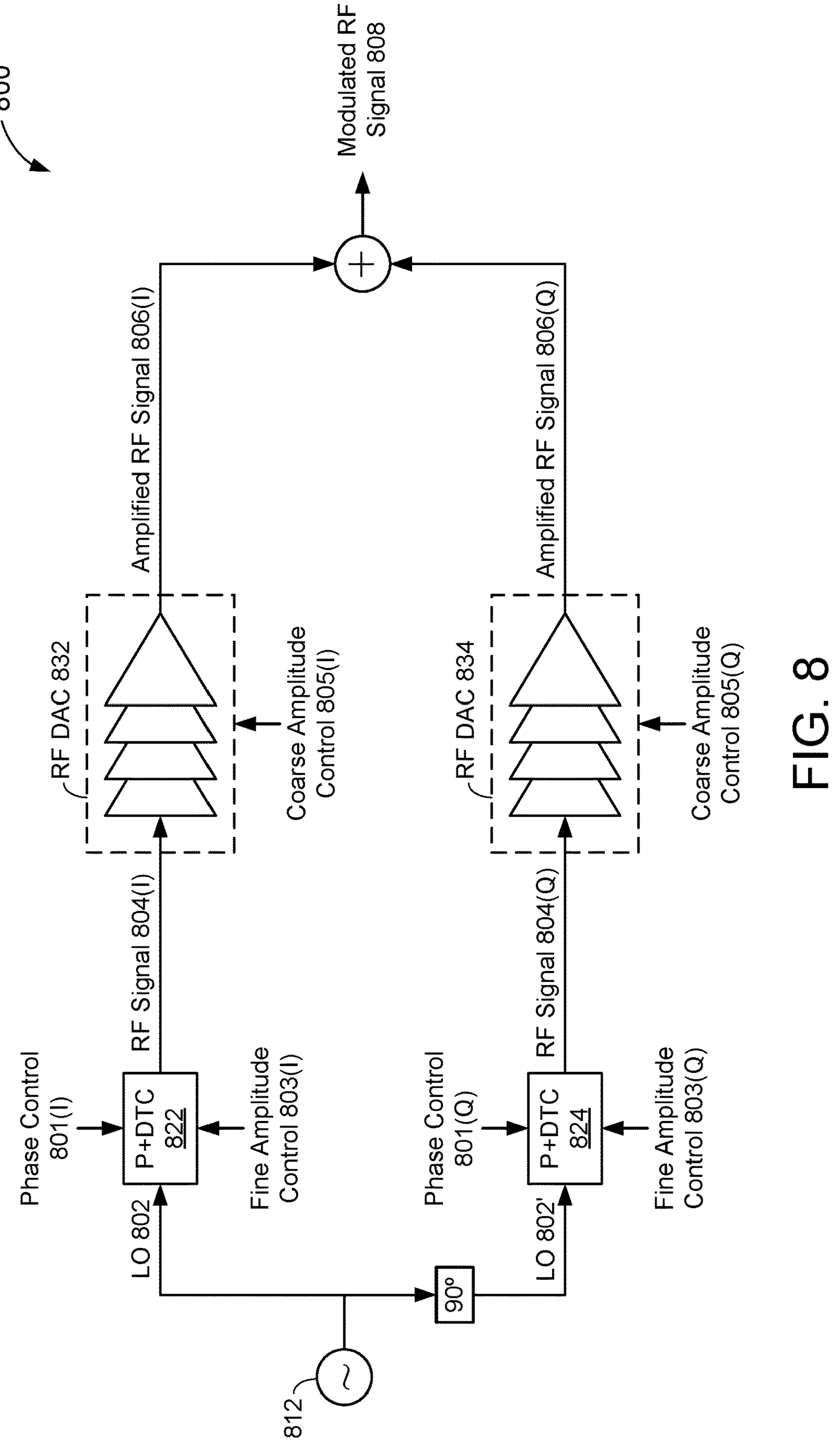
FIG. 8 shows another block diagram of an example RF transmitter that supports quadrature modulation, according to some implementations.

FIG. 8 shows another block diagram of an example RF transmitter 800 that supports quadrature modulation, according to some implementations. In some implementations, the RF transmitter 800 may be one example of the RF transmitter 400 of FIG. 4. More specifically, the RF transmitter 800 is configured to produce a modulated RF signal 808 based on phase control words 801(I) and 801(Q), fine amplitude control words 803(I) and 803(Q), and coarse amplitude control words 805(I) and 805(Q).

In some implementations, the phase control words 801(I) and 801(Q), fine amplitude control words 803(I) and 803 (Q), and coarse amplitude control words 805(I) and 805(Q) may represent TX data to be carried on the modulated RF signal 808. With reference to FIG. 4, the phase control words 801(I) and 801(Q) and fine amplitude control words 803(I) and 803(Q) may be one example of the control words 442, and the coarse amplitude control words 805(I) and 805(Q) may be one example of the control words 446, generated by the modulation controller 440 based on the TX data 402, and the modulated RF signal 808 may be one example of the modulated RF signal 408. More specifically, the phase control words 801(I) and 801(Q) may control a phase of the modulated RF signal 808 in accordance with a quadrature modulation scheme (such as QPSK or QAM), and the fine amplitude control words 803(I) and 803(Q) and coarse amplitude control words 805(I) and 805(Q) may control an amplitude of the modulated RF signal 808 in accordance with the quadrature modulation scheme.

The RF transmitter 800 includes a local oscillator 812, phase and duty cycle controllers (P+DTCs) 822 and 824, and radio frequency (RF) digital-to-analog converters (DACs) 832 and 834. The local oscillator 812 generates an LO signal 802 that oscillates at a radio frequency. The LO signal 802 is provided as input to the P+DTC 822, and a phase-shifted LO signal 802' is provided as input to the P+DTC 824. The phase-shifted LO signal 802' oscillates at the same radio frequency as the LO signal 802 but is 90° out of phase with the LO signal 802. As such, the LO signals 802 and 802' represent in-phase and quadrature components of the modulated RF signal 808. With reference to FIG. 4, the LO signals 802 and 802' may be examples of the RF signals 404(I) and 404(Q), respectively, output by the signal generation component 410.

The P+DTCs 822 and 824 are configured to adjust the duty cycles and phases of the LO signals 802 and 802', respectively. More specifically, the P+DTC 822 may produce an RF signal 804(I) having a phase associated with the phase control word 801(I) and a duty cycle associated with the fine amplitude control word 803(1), and the P+DTC 824 may produce an RF signal 804(Q) having a phase associated with the phase control word 801(Q) and a duty cycle associated with the fine amplitude control word 803(Q). In some implementations, each of the P+DTCs 822 and 824 may be one example of the phase and duty cycle controller 700 of FIG. 7. With reference to FIG. 4, the RF signals 804(I) and 804(Q) may be examples of the RF signals 406(I) and 406(Q), respectively, output by the duty cycle adjustment component 420.

The RF DACs 832 and 834 are configured to amplify the RF signals 804(I) and 804(Q) by respective gains based on the coarse amplitude control words 805(I) and 805(Q), respectively, and the duty cycle of each RF signal. In some implementations, each of the RF DACs 832 and 834 may be associated with multiple ("digital") power amplifiers (PAs), where each PA has a respective range of output power. The coarse amplitude control word 805(I) may select one of the PAs associated with the RF DAC 832, and the coarse amplitude control word 805(Q) may select one of the PAs associated with the RF DAC 834. Thus, the RF DAC 832 may produce an amplified RF signal 806(I), where the voltage gains between the RF signals 804(I) and 806(I) depend on the duty cycle of the RF signal 804(I) and the output power of the PA selected by the coarse amplitude control word 805(I). Similarly, the RF DAC 834 may produce an amplified RF signal 806(Q), where the voltage gains between the RF signals 804(Q) and 806(Q) depend on the duty cycle of the RF signal 804(Q) and the output power of the PA selected by the coarse amplitude control word 805(Q). The amplified RF signals 806(I) and 806(Q) are summed together to produce the modulated RF signal 808.

In the example of FIG. 8, the P+DTCs 822 and 824 are configured to modulate the phase of the RF signal 808 in response to the phase control words 801(I) and 801(Q). For example, the phase control words 801(I) and 801(Q) may control the phases of the RF signals 804(I) and 804(Q), respectively, so that the modulated RF signal 808 has a desired phase when the resulting amplified RF signals 806(I) and 806(Q) are summed or combined. The P+DTCs 822 and 824, in combination with the RF DACs 832 and 834, are configured to modulate the amplitude of the RF signal 808 in response to the fine amplitude control words 803(I) and 803(Q) and the coarse amplitude control words 805(I) and 805(Q). For example, the fine amplitude control words 803(1) and 803(Q) may control the duty cycles of the RF signals 804(I) and 804(Q) so that, when the RF signals 804(I) and 804(Q) are amplified by the PAs selected by the coarse amplitude control words 805(I) and 805(Q), the modulated RF signal 808 has a desired amplitude when the resulting amplified RF signals 806(I) and 806(Q) are summed or combined.

Figure 9:
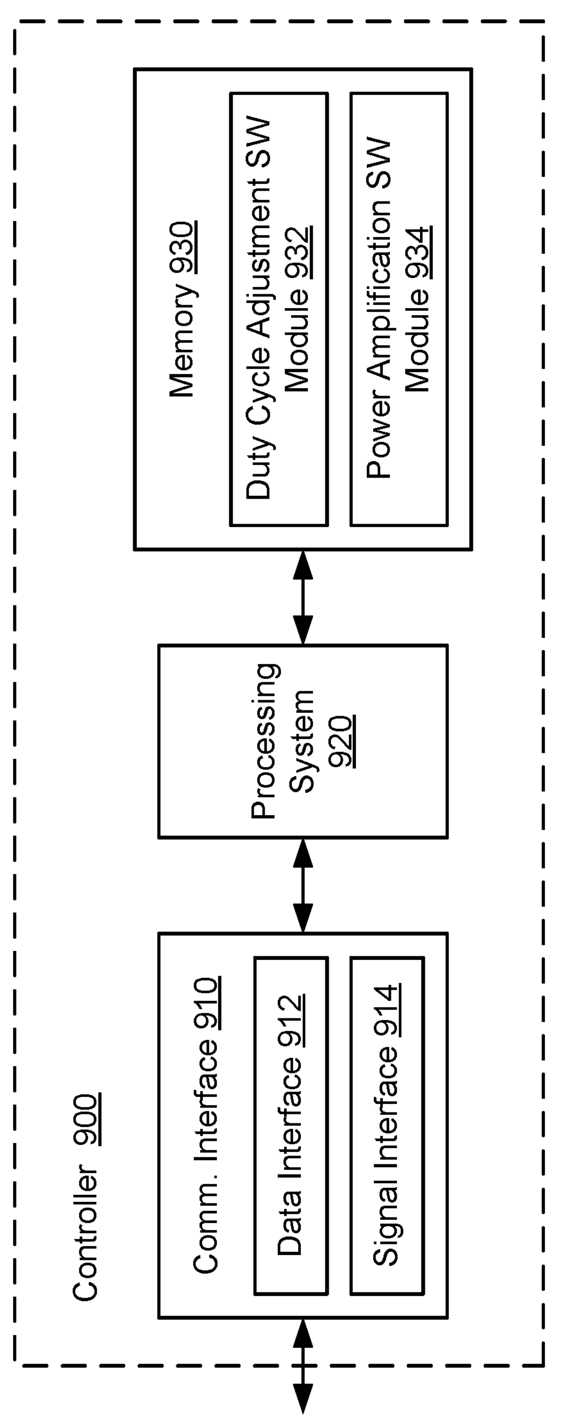
FIG. 9 shows a block diagram of an example controller for an RF transmitter, according to some implementations.

FIG. 9 shows a block diagram of an example controller 900 for an RF transmitter, according to some implementations. In some implementations, the controller 900 may be one example of the modulation controller 440 of FIG. 4. More specifically, the controller 900 may be configured to modulate an RF signal to carry TX data over a wireless communication channel.

The controller 900 includes a communication interface 910, a processing system 920, and a memory 930. The communication interface 910 is configured to communicate with one or more components of the RF transmitter. In some implementations, the communication interface 910 may include a data interface 912 and a signal interface 914. The data interface 912 is configured to obtain data for transmission according to a modulation scheme (such as the TX data 402 of FIG. 4). The signal interface 914 is configured to obtain one or more RF signals associated with the modulation scheme (such as the RF signals 404(I) and 404(Q) of FIG. 4).

The memory 930 may include a non-transitory computer-readable medium (including one or more nonvolatile memory elements, such as EPROM, EEPROM, Flash memory, or a hard drive, among other examples) that may store at least the following software (SW) modules:

a duty cycle adjustment SW module 932 to adjust a duty cycle of each RF signal of the one or more RF signals based on the data and the modulation scheme; and a power amplification SW module 934 to provide the one or more RF signals to a set of power amplifiers configured to amplify each RF signal of the one or more RF signals by a respective gain based at least in part on the adjusted duty cycle of the RF signal and produce a modulated waveform carrying the data based on the one or more amplified RF signals.

Each software module includes instructions that, when executed by the processing system 920, causes the controller 900 to perform the corresponding functions.

The processing system 920 may include any suitable one or more processors capable of executing scripts or instructions of one or more software programs stored in the controller 900 (such as in the memory 930). For example, the processing system 920 may execute the duty cycle adjustment SW module 932 to adjust a duty cycle of each RF signal of the one or more RF signals based on the data and the modulation scheme. The processing system 920 may further execute the power amplification SW module 934 to provide the one or more RF signals to a set of power amplifiers configured to amplify each RF signal of the one or more RF signals by a respective gain based at least in part on the adjusted duty cycle of the RF signal and produce a modulated waveform carrying the data based on the one or more amplified RF signals.

Figure 10:
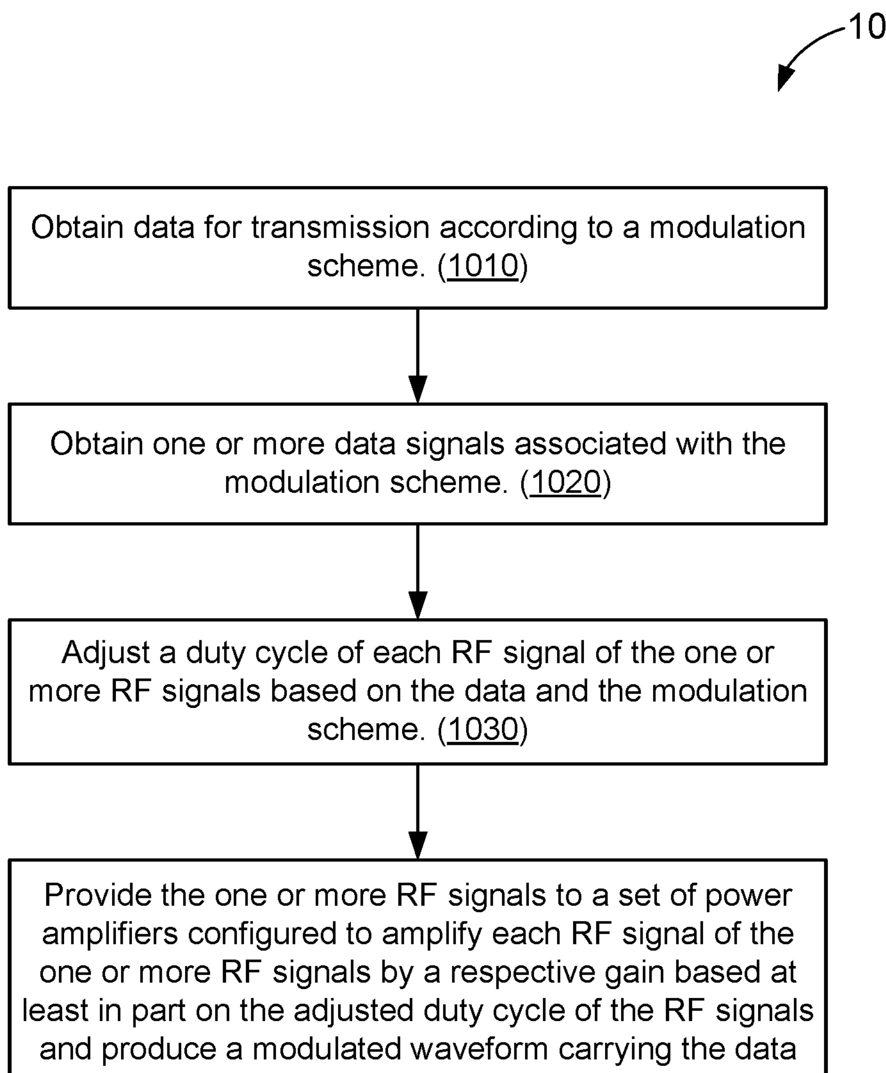
FIG. 10 shows an illustrative flowchart depicting an example operation for wireless communication, according to some implementations.

FIG. 10 shows an illustrative flowchart depicting an example operation 1000 for wireless communication, according to some implementations. In some implementations, the example operation 1000 may be performed by a controller for an RF transmitter such as the modulation controller 440 of FIG. 4 or the controller 900 of FIG. 9.

The controller obtains data for transmission according to a modulation scheme (1010). The controller also obtains one or more data signals associated with the modulation scheme (1020). In some implementations, the one or more RF signals may include a first RF signal representing an in-phase component of the modulated waveform and a second RF signal representing a quadrature component of the modulated waveform. The controller adjusts a duty cycle of each RF signal of the one or more RF signals based on the data and the modulation scheme (1030). The controller further provides the one or more RF signals to a set of power amplifiers configured to amplify each RF signal of the one or more RF signals by a respective gain based at least in part on the adjusted duty cycle of the RF signal and produce a modulated waveform carrying the data based on the one or more amplified RF signals (1040). In some implementations, the modulated waveform may be a sum of the first RF signal and the second RF signal.

In some aspects, the obtaining of the one or more RF signals may include determining first and second digital inputs associated with a phase of the modulated waveform; generating a first analog signal having a first phase based on the first digital input; and generating a second analog signal having a second phase based on the second digital input. In some implementations, the first RF signal may include the first analog signal mixed with a first LO signal that oscillates at a radio frequency, and the second RF signal may include the second analog signal mixed with a second LO signal that oscillates at the radio frequency and is offset in phase relative to the first LO signal by 90°.

In some other aspects, the first RF signal may be a first LO signal that oscillates at a radio frequency and the second RF signal may be a second LO signal that oscillates at the radio frequency and is offset in phase relative to the first LO signal by 90°. In some implementations, the controller may delay at least one of the first or second RF signals based on a phase of the modulated waveform.

In some aspects, the duty cycle of each RF signal of the one or more RF signals may be adjusted based at least in part on an amplitude of the modulated waveform. In some implementations, the set of power amplifiers may include an RF DAC. In some implementations, the controller may further determine a fine amplitude adjustment factor and a coarse amplitude adjustment factor based on the amplitude of the modulated waveform, where the duty cycle of each RF signal of the one or more RF signals is adjusted based on the fine amplitude adjustment factor; and select a range of output power associated with the RF DAC based on the coarse amplitude adjustment factor.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

In the foregoing specification, embodiments have been described with reference to specific examples thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A method of wireless communication performed by a radio frequency (RF) transmitter, comprising:

obtaining data for transmission as a modulated waveform according to a modulation scheme;

obtaining first and second RF signals representing in-phase and quadrature components, respectively, of the modulated waveform;

adjusting a respective duty cycle of each of the first and second RF signals based on the data and the modulation scheme; and providing the first and second RF signals to a set of power amplifiers configured to amplify each of the first and second RF signals by a respective gain based at least in part on its adjusted duty cycle and produce the modulated waveform based on the amplified first and second RF signals.

2. The method of claim 1, wherein the modulated waveform is a sum of the first RF signal and the second RF signal.

3. The method of claim 1, wherein the obtaining of the one first and second RF signals comprises:

determining first and second digital inputs associated with a phase of the modulated waveform; and generating a first analog signal having a first phase based on the first digital input; and generating a second analog signal having a second phase based on the second digital input.

4. The method of claim 3, wherein the first RF signal comprises the first analog signal mixed with a first local oscillator (LO) signal that oscillates at a radio frequency, and the second RF signal comprises the second analog signal mixed with a second LO signal that oscillates at the radio frequency and is offset in phase relative to the first LO signal by 90°.

5. The method of claim 1, wherein the first RF signal is a first LO signal that oscillates at a radio frequency and the second RF signal is a second LO signal that oscillates at the radio frequency and is offset in phase relative to the first LO signal by 90°.

6. The method of claim 5, further comprising:

delaying at least one of the first or second RF signals based on a phase of the modulated waveform.

7. The method of claim 1, wherein the duty cycle of each of the first and second RF signals is adjusted based at least in part on an amplitude of the modulated waveform.

8. The method of claim 7, wherein the set of power amplifiers comprises an RF DAC.

9. The method of claim 8, further comprising:

determining a fine amplitude adjustment factor and a coarse amplitude adjustment factor based on the amplitude of the modulated waveform, the duty cycle of each of the one first and second RF signals being adjusted based on the fine amplitude adjustment factor; and selecting a range of output power associated with the RF DAC based on the coarse amplitude adjustment factor.

10. A controller for a radio frequency (RF) transmitter, comprising:

a processing system; and a memory storing instructions that, when executed by the processing system, cause the controller to:

obtain data for transmission as a modulated waveform according to a modulation scheme;

obtain first and second RF signals representing in-phase and quadrature components, respectively, of the modulated waveform;

adjust a respective duty cycle of each of the first and second RF signals based on the data and the modulation scheme; and provide the first and second RF signals to a set of power amplifiers configured to amplify each of the first and second RF signals by a respective gain based at least in part on its adjusted duty cycle and produce the modulated waveform based on the amplified first and second RF signals.

11. The controller of claim 10, wherein the modulated waveform is a sum of the first RF signal and the second RF signal.

12. The controller of claim 10, wherein the obtaining of the first and second RF signals comprises:

determining first and second digital inputs associated with a phase of the modulated waveform; and generating a first analog signal having a first phase based on the first digital input; and generating a second analog signal having a second phase based on the second digital input.

13. The controller of claim 12, wherein the first RF signal comprises the first analog signal mixed with a first local oscillator (LO) signal that oscillates at a radio frequency, and the second RF signal comprises the second analog signal mixed with a second LO signal that oscillates at the radio frequency and is offset in phase relative to the first LO signal by 90°.

14. The controller of claim 10, wherein the first RF signal is a first LO signal that oscillates at a radio frequency and the second RF signal is a second LO signal that oscillates at the radio frequency and is offset in phase relative to the first LO signal by 90°.

15. The controller of claim 14, wherein execution of the instructions further causes the controller to:

delay at least one of the first or second RF signals based on a phase of the modulated waveform.

16. The controller of claim 10, wherein the duty cycle of each of the first and second RF signals is adjusted based at least in part on an amplitude of the modulated waveform.

17. The controller of claim 16, wherein the set of power amplifiers comprises an RF DAC.

18. The controller of claim 17, wherein execution of the instructions further causes the controller to:

determine a fine amplitude adjustment factor and a coarse amplitude adjustment factor based on the amplitude of the modulated waveform, the duty cycle of each of the first and second RF signals being adjusted based on the fine amplitude adjustment factor; and select a range of output power associated with the RF DAC based on the coarse amplitude adjustment factor.

* * * * *